(12) United States Patent
Lai et al.

(10) Patent No.: US 11,855,207 B2
(45) Date of Patent: *Dec. 26, 2023

(54) FINFET STRUCTURE AND METHOD WITH REDUCED FIN BUCKLING

(71) Applicant: Taiwan Semiconductor Manufacturing Co., Ltd., Hsinchu (TW)

(72) Inventors: Wei-Jen Lai, Keelung (TW); Yen-Ming Chen, Hsin-Chu County (TW); Tsung-Lin Lee, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/876,330

(22) Filed: Jul. 28, 2022

(65) Prior Publication Data

US 2022/0384650 A1 Dec. 1, 2022

Related U.S. Application Data

(60) Continuation of application No. 17/113,955, filed on Dec. 7, 2020, now Pat. No. 11,411,107, which is a
(Continued)

(51) Int. Cl.
*H01L 21/8238* (2006.01)
*H01L 29/78* (2006.01)
(Continued)

(52) U.S. Cl.
CPC ...... *H01L 29/7843* (2013.01); *H01L 21/0217* (2013.01); *H01L 21/02211* (2013.01); *H01L 21/02271* (2013.01); *H01L 21/28088* (2013.01); *H01L 21/76224* (2013.01); *H01L 21/823807* (2013.01); *H01L 21/823821* (2013.01); *H01L 21/823842* (2013.01); *H01L 21/823878* (2013.01); *H01L 27/0924* (2013.01);
(Continued)

(58) Field of Classification Search
CPC .......... H01L 21/0217; H01L 21/02211; H01L 21/02271; H01L 21/28088; H01L 21/76224; H01L 21/823807; H01L 21/823821; H01L 21/823842; H01L 21/823878; H01L 27/0924; H01L 29/0649; H01L 29/1054; H01L 29/4966; H01L 29/7843
USPC ........................................................ 438/671
See application file for complete search history.

(56) References Cited

U.S. PATENT DOCUMENTS 10,861,969 B2 * 12/2020 Lai ...................... H01L 21/0217

* cited by examiner

*Primary Examiner* — Hoai V Pham
(74) *Attorney, Agent, or Firm* — HAYNES AND BOONE, LLP

(57) ABSTRACT

The present disclosure provides one embodiment of a method making semiconductor structure. The method includes forming a composite stress layer on a semiconductor substrate, wherein the forming of the composite stress layer includes forming a first stress layer of a dielectric material with a first compressive stress and forming a second stress layer of the dielectric material with a second compressive stress on the first stress layer, the second compressive stress being greater than the first compressive stress; and patterning the semiconductor substrate to form fin active regions using the composite stress layer as an etch mask.

20 Claims, 17 Drawing Sheets

Related U.S. Application Data division of application No. 16/414,565, filed on May 16, 2019, now Pat. No. 10,861,969.

(60) Provisional application No. 62/698,357, filed on Jul. 16, 2018.

(51) Int. Cl.
*H01L 27/092* (2006.01)
*H01L 29/10* (2006.01)
*H01L 29/49* (2006.01)
*H01L 29/06* (2006.01)
*H01L 21/02* (2006.01)
*H01L 21/28* (2006.01)
*H01L 21/762* (2006.01)

(52) U.S. Cl.
CPC ...... *H01L 29/0649* (2013.01); *H01L 29/1054* (2013.01); *H01L 29/4966* (2013.01)

FINFET STRUCTURE AND METHOD WITH REDUCED FIN BUCKLING

CROSS REFERENCE

This application a Continuation Application of U.S. patent application Ser. No. 17/113,955, filed Dec. 7, 2020, which is a Divisional Application of U.S. patent application Ser. No. 16/414,565, filed May 16, 2019, which further claims the benefit of U.S. Provisional Application 62/698,357 entitled "FINFET STRUCTURE AND METHOD WITH FIN BUCKLING IMPROVEMENT," filed Jul. 16, 2018. The entire disclosures of which are herein incorporated by reference.

BACKGROUND

Integrated circuits have progressed to advanced technologies with smaller feature sizes, such as 16 nm, 9 nm and 7 nm. In these advanced technologies, the devices (such as transistors) shrink and therefore induce various issues, such as contact to gate bridging concern. Furthermore, three dimensional transistors with fin active regions are often desired for enhanced device performance. Those three-dimensional field effect transistors (FETs) formed on fin active regions are also referred to as FinFETs. The FinFETs are desired to have narrow fin width for short channel control, which leads to high aspect ratio of the fin active regions. Accordingly, the fin active regions are thinner with less mechanical strength, which induces fin buckling issues during subsequent processes and degrades the device performance. Therefore, there is a need for a device structure and a method for fin transistors to address these concerns for enhanced circuit performance.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1A:
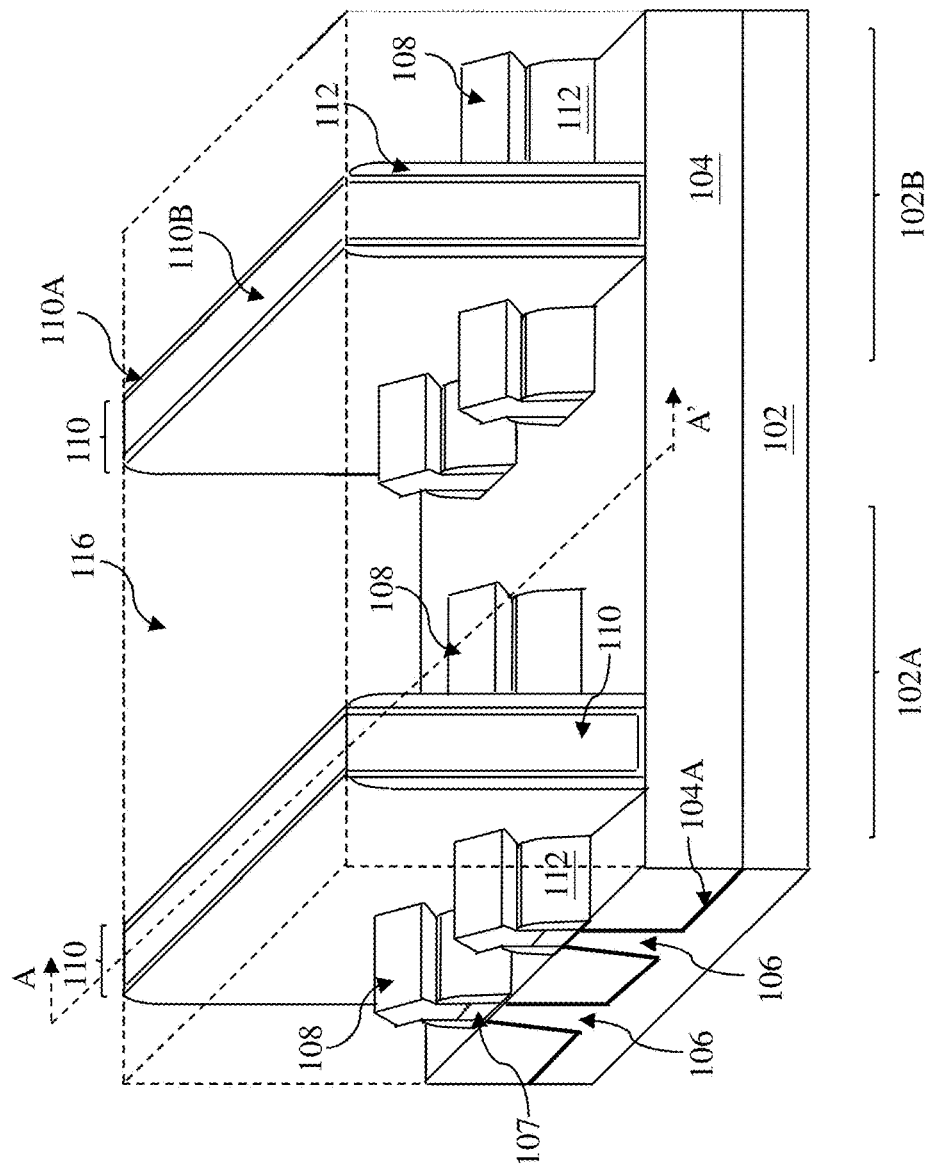
FIG. 1A is a perspective view of a semiconductor structure constructed according to various embodiments.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features. Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

Figure 1B:
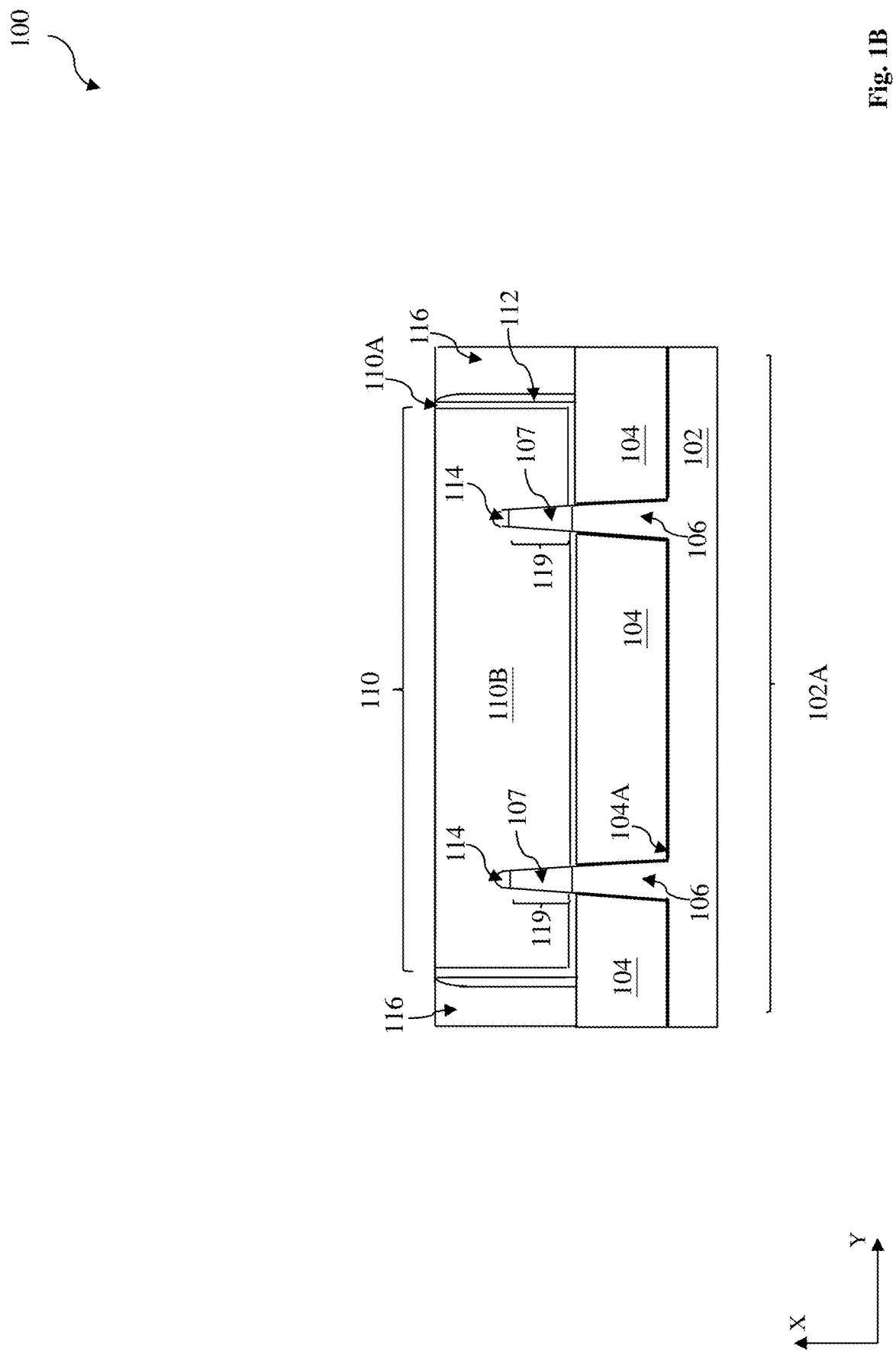
FIG. 1B is a sectional view of the semiconductor structure of FIG. 1A constructed according to various embodiments.
Figure 2:
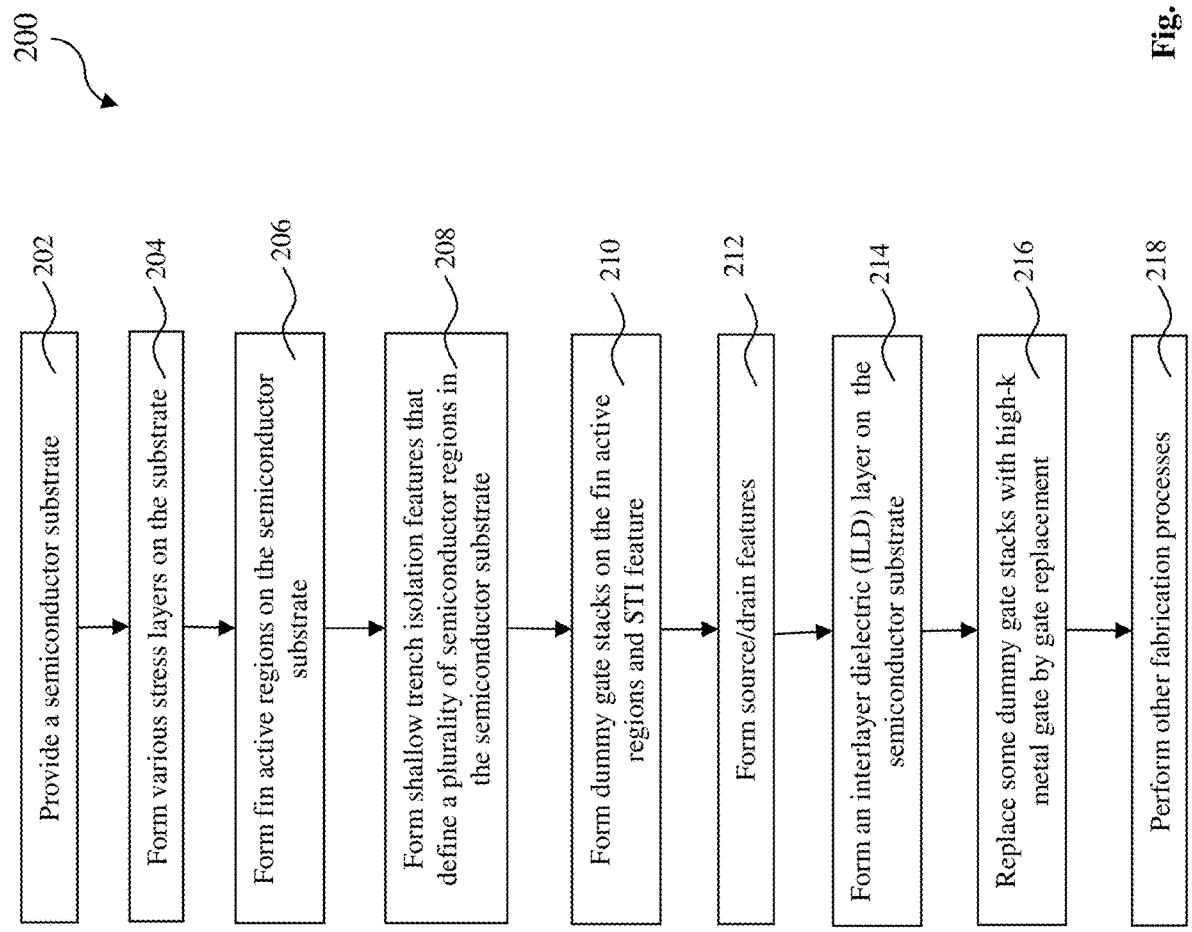
FIG. 2 is a flowchart of a method making a semiconductor structure constructed according to various aspects of the present disclosure in some embodiments.
Figure 12:
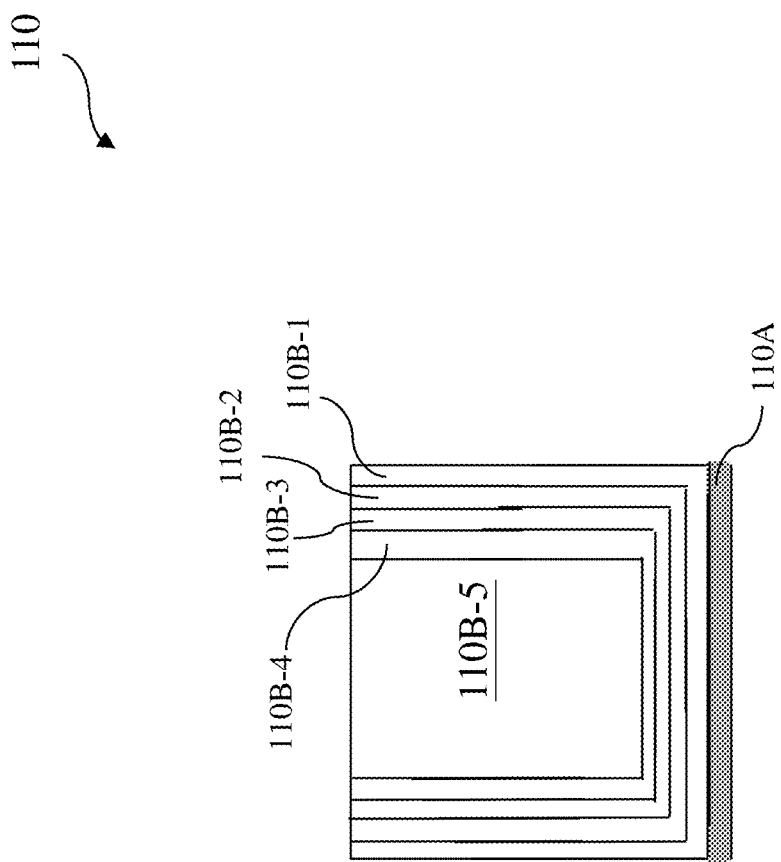
FIGS. 12 and 13 are sectional views of a gate stack of the semiconductor structure constructed according to various embodiments.
Figure 13:
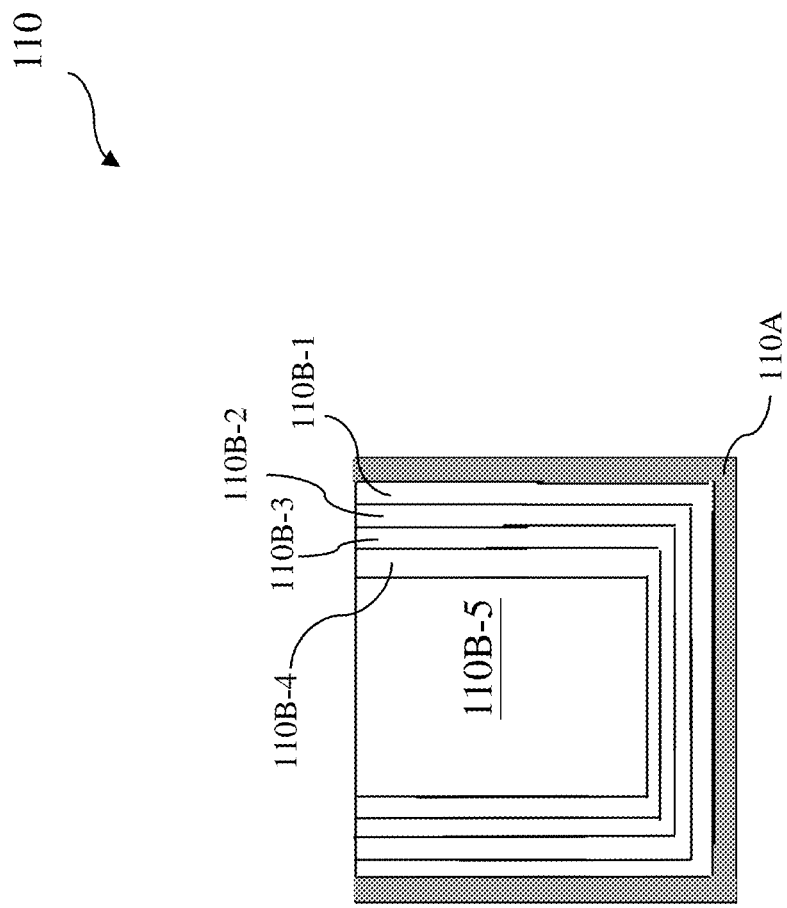

The present disclosure provides a structure and a method making the same to address the fin buckling issue. FIG. 1A is a perspective view of a semiconductor structure 100 and FIG. 1B is a sectional view of the semiconductor structure 100 along the dashed line AA', constructed in accordance with some embodiments constructed in accordance with some embodiments. The semiconductor structure 100 includes a semiconductor substrate 102 with various field effect transistors (FETs) formed thereon. Particularly, the semiconductor structure 100 includes a first region 102A with p-type FETs (PFETs) formed thereon and a second region 102B with n-type FETs (NFETs) formed thereon. FIG. 2 is a flowchart of a method 200 making a semiconductor structure, such as the semiconductor structure 100, in accordance with some embodiments. FIGS. 3 through 9 are perspective or sectional views of the semiconductor structure 100 at various fabrication stages in accordance with some embodiments. FIGS. 12 and 13 are sectional views of a gate stack in the semiconductor structure 100 in accordance with various embodiments. The semiconductor structure 100 and the method 200 making the same are collectively described below with reference to FIGS. 1 through 13.

Referring to FIGS. 1A and 1B, the semiconductor structure 100 includes a semiconductor substrate 102 having a first region 102A for PFETs and a second region 102B for NFETs. The semiconductor structure 100 includes various isolation features 104, such as shallow trench isolation (STI) features. The semiconductor structure 100 also includes various fin active regions 106 formed on the semiconductor substrate 102. The fin active regions 106 are extruded above the isolation features 104 and are surrounded and isolated from each other by the isolation features 104. Various fin field effect transistors are formed on the fin active regions 106. In the present embodiments, PFETs are disposed on the fin active regions 106 within the first region 102A and NFETs are disposed on the fin active regions 106 within the second region 102B. In some embodiments, a silicon germanium (SiGe) layer 107 is epitaxially grown on the semiconductor substrate 102 within the first region 102A to enhance the carrier mobility and device speed. Sources and drains 108 are formed on the fin active regions 106, and gate stacks 110 are formed on the fin active regions 106 and disposed between the corresponding source and drain 108. Each of the gate stacks 110 includes a gate dielectric layer 110A and a gate electrode 110B. Spacers 112 may be further formed on sidewalls of the gate electrode 110B and sidewalls of the fin active regions 106 as well. A channel 119 is a portion of a fin active region 106 underlying the corresponding gate stack 110. The corresponding source and drain 108; the gate stack 110; and the channel 119 are coupled to a field effect transistor. In the present example illustrated in FIGS. 1A and 1B, the first region 102A includes two PFETs and the second region 102B includes two NFETs.

The semiconductor structure 100 further includes an interlayer dielectric (ILD) layer 116 disposed on the fin active regions 106 and surrounding the gate stacks 110. The ILD layer 116 in FIG. 1A is drawn in dashed lines and is illustrated as transparent to have better viewing of various features, such as gate stacks 110 and the fin active regions 106. Since the fin active regions 106 are extruded above the isolation features 104, the gate stacks 110 are coupled to the corresponding channel 119 more effectively through sidewalls and top surface of the fin active region 106, therefore enhancing the device performance.

Particularly, as illustrated in FIG. 1B, a composite stress layer 114 is disposed on the top surface of the fin active regions 106 and underlying the gate stacks 110. The composite stress layer 114 is a dielectric material layer with engineered stress to hold the fins without buckling. The composite stress layer 114 may function for other purposes, such as a hard mask layer used to pattern the fin active regions 106. The composite stress layer 114 is dielectric and includes silicon nitride according to present embodiment. The composite stress layer 114 has portions remaining on the top surfaces of the fin active regions 106 after various etching processes to form the fin active regions 106.

The semiconductor structure 100 is formed by the method 200 using the composite stress layer 114 to anchor the fin active regions 106 and to prevent from buckling. The semiconductor structure 100, especially the composite stress layer 114, and the method 200 are further described below in details. By implementing the semiconductor structure 100 and the method 200 making the same, the fin buckling issue is eliminated or reduced. Furthermore, line-end roughness (LER) is also improved and reduced to be less than 2.5 nm.

Figure 3:
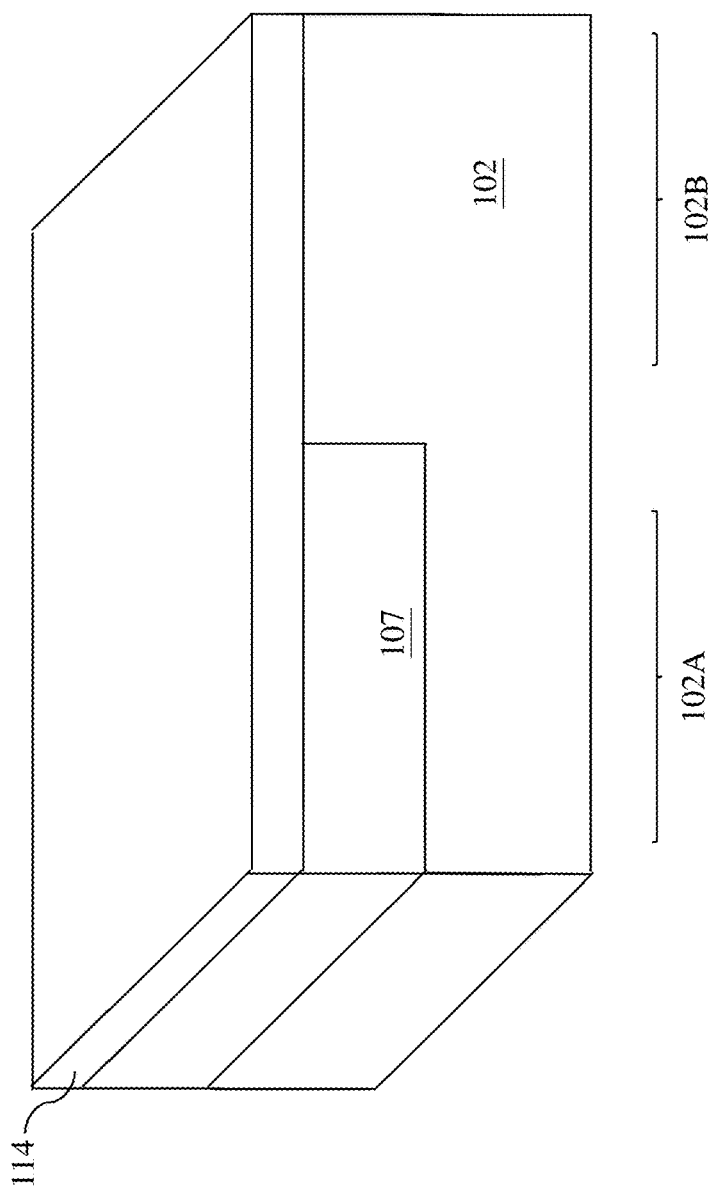
FIG. 3 is a perspective view of a semiconductor structure at a fabrication stage constructed according to some embodiments.

Referring to FIG. 3, the method 200 begins at block 202 by providing a semiconductor substrate 102. The semiconductor substrate 102 includes silicon. In some other embodiments, the substrate 102 includes germanium, silicon germanium or other proper semiconductor materials. The substrate 102 may alternatively be made of some other suitable elementary semiconductor, such as diamond or germanium; a suitable compound semiconductor, such as silicon carbide, indium arsenide, or indium phosphide; or a suitable alloy semiconductor, such as silicon germanium carbide, gallium arsenic phosphide, or gallium indium phosphide.

In the present embodiment, the substrate 102 includes silicon and a silicon germanium layer 107 is epitaxially grown on the substrate 102 within the first region 102A to enhance the carrier mobility for PFETs. The SiGe layer 107 may be formed by any suitable procedure. For example, a hard mask layer may be deposited and patterned to cover the second region 102B and expose the first region 102A; an etching process is applied to etch the substrate 102 within the first region 102A using the patterned hard mask as an etching mask; a selective epitaxial growth is applied to form the SiGe layer 107 within the first region; and a chemical mechanical polishing (CMP) process is applied to planarize the top surface.

The semiconductor substrate 102 may also include various doped regions such as n-wells and p-wells. In some embodiments, the semiconductor substrate 102 may include a buried dielectric material layer for isolation formed by a proper technology, such as a technology referred to as separation by implanted oxygen (SIMOX).

Still referring to FIG. 3, the method 200 proceeds to an operation 204 by forming a composite stress layer 114 on the semiconductor substrate 102 in both the first region 102A for PFETs and the second region 102B for NFETs. The composite stress layer 114 includes multiple films with engineered stresses to provide combined physical characteristics in order to reduce the fin buckling and further to function as hard mask during the subsequent patterning process to form fin active regions 106.

Figure 3A:
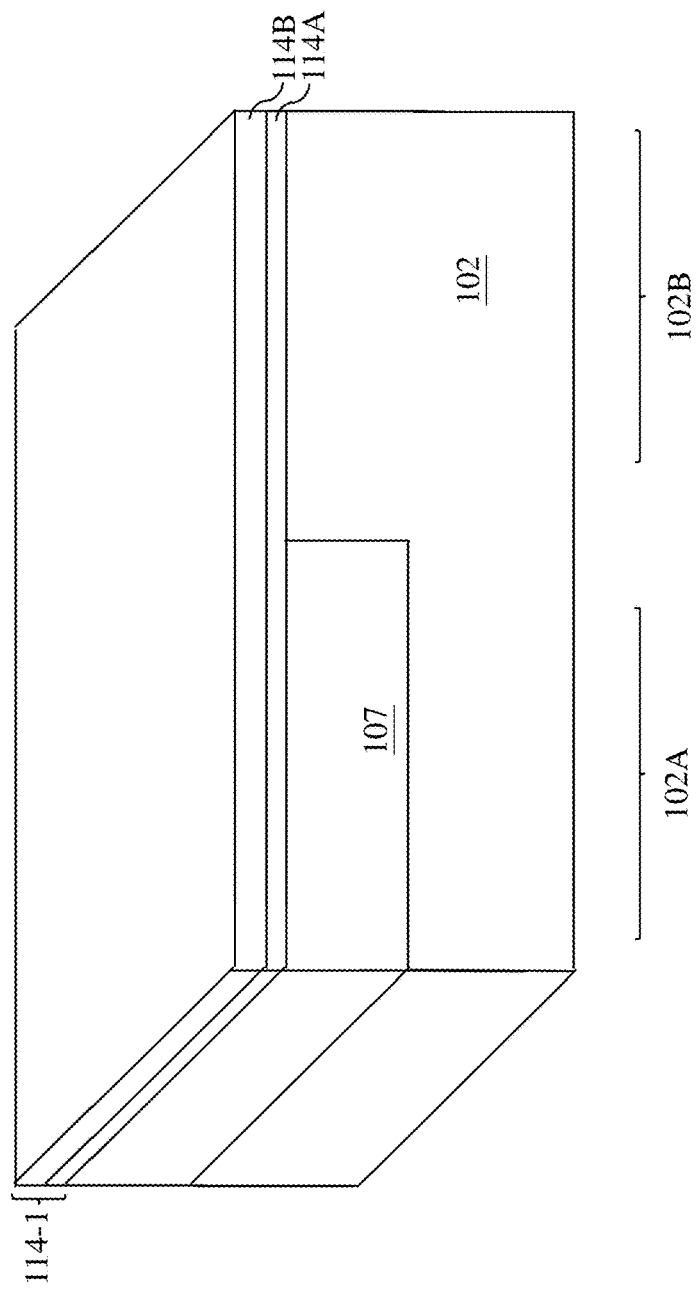
FIGS. 3A, 3B and 3C are perspective views of a semiconductor structure at a fabrication stage constructed according to various embodiments.

In some embodiments as illustrated in FIG. 3A, the composite stress layer 114 (the composite stress layer 114 in FIG. 3A is also referred to as 114-1) includes a first stress layer 114A and a second stress layer 114B on the first stress layer 114A. Both layers are dielectric material layers. The first stress layer 114A has a higher density (volumetric mass density) and less stress relative to the second stress layer 114B. In the present embodiment, both stress layers have compressive stresses. Specifically, the first stress layer 114A has a first compressive stress and a first density; and the second stress layer 114B has a second compressive stress and a second density. The first density is greater than the second density; and the first compressive stress is less than the second compressive stress. Furthermore, the first stress layer 114A has a first Young's modulus and the second stress layer 114B has a second Young's modulus being less than the first Young's modulus.

In the present embodiment, the first stress layer 114A is a silicon nitride (SiN) layer formed by chemical vapor deposition (CVD). The corresponding CVD deposition temperature ranges from 500° C. to 550° C. in some examples. The precursor of the CVD process to form the first stress layer 114A includes dichlorosilane (DCS or $SiH_2Cl_2$), ammonia ($NH_3$) and $H_2$. Particularly, the hydrogen gas $H_2$ is added into the precursor to increase the density of the first stress layer 114A. The compressive stress of the first stress layer 114A ranges between 0.2 GPa and 0.4 GPa; and the Young's modulus of the first stress layer 114A ranges between 200

GPa and 300 GPa according to some examples. The first stress layer 114A has a thickness ranging between 10 nm and 20 nm, in some examples.

The second stress layer 114B is deposited over the first stress layer 114A in both the first region 102A and the second region 102B. In the present embodiment, the second stress layer 114B is silicon nitride (SiN) formed by CVD as well. The corresponding CVD deposition temperature ranges from 480° C. to 520° C. The precursor of the corresponding CVD process to form the second stress layer 114B includes DCS and $NH_3$ but without $H_2$. Thus, as noted above, the second stress layer 114B has a compressive stress greater than that of the first stress layer 114A and has a density less than that of the first stress layer 114A. Furthermore, the second stress layer 114B has a lower young's modulus, and a greater thickness relative to those of the first stress layer 114A. In some examples, the second stress layer 114B has a compressive stress ranging between 2.8 GPa and 3.0 GPa; and a Young's modulus ranging between 160 GPa and 270 GPa. In some examples, the second stress layer 114B has a thickness ranging between 15 nm and 25 nm.

Figure 3B:
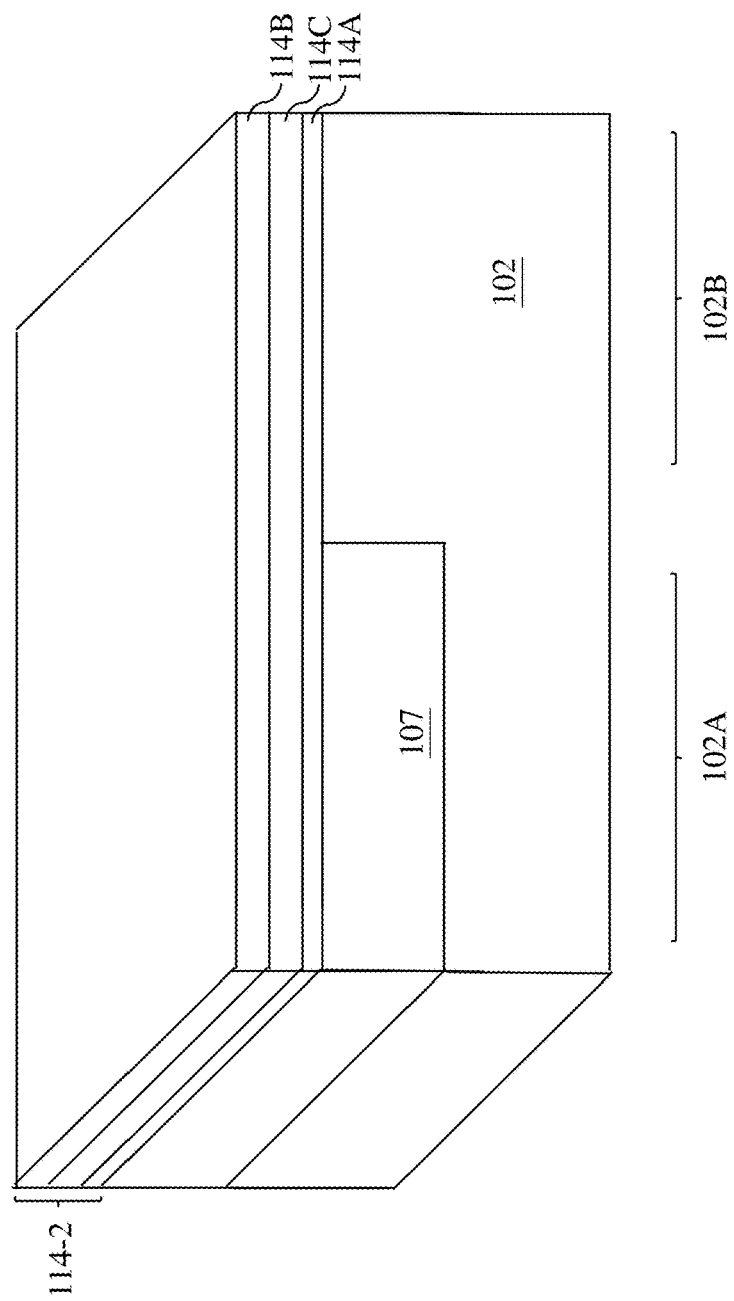

In some other embodiments as illustrated in FIG. 3B, the composite stress layer 114 (the composite stress layer 114 in FIG. 3B is also referred to as 114-2) includes a third stress layer 114C that is inserted between the first and second stress layers. In the present embodiment, the third stress layer 114C includes amorphous silicon formed by CVD. However, the third stress layer 114C is formed to have a tensile stress, such as s tensile stress ranging between −0.3 GPa and −0.5 GPa. The precursor to form the third stress layer 114C includes $Si_2H_6$ or other suitable chemical. The corresponding CVD deposition temperature is less than the deposition temperatures to form the first and second stress layers 114A and 114B. In the present example, the corresponding CVD deposition temperature to form the third stress layer 114C ranges from 350° C. to 400° C. The third stress layer 114C has a Young's modulus ranging between 150 GPa and 170 GPa according to some examples. The third stress layer 114C has a thickness ranging between 5 nm and 10 nm according to some examples. Those stress layers, collectively the composite stress layer 114 (or 114-2), are combined with respective characteristics designed to address the buckling issue and also function as a hard mask used to form the fin active regions 106.

Figure 3C:
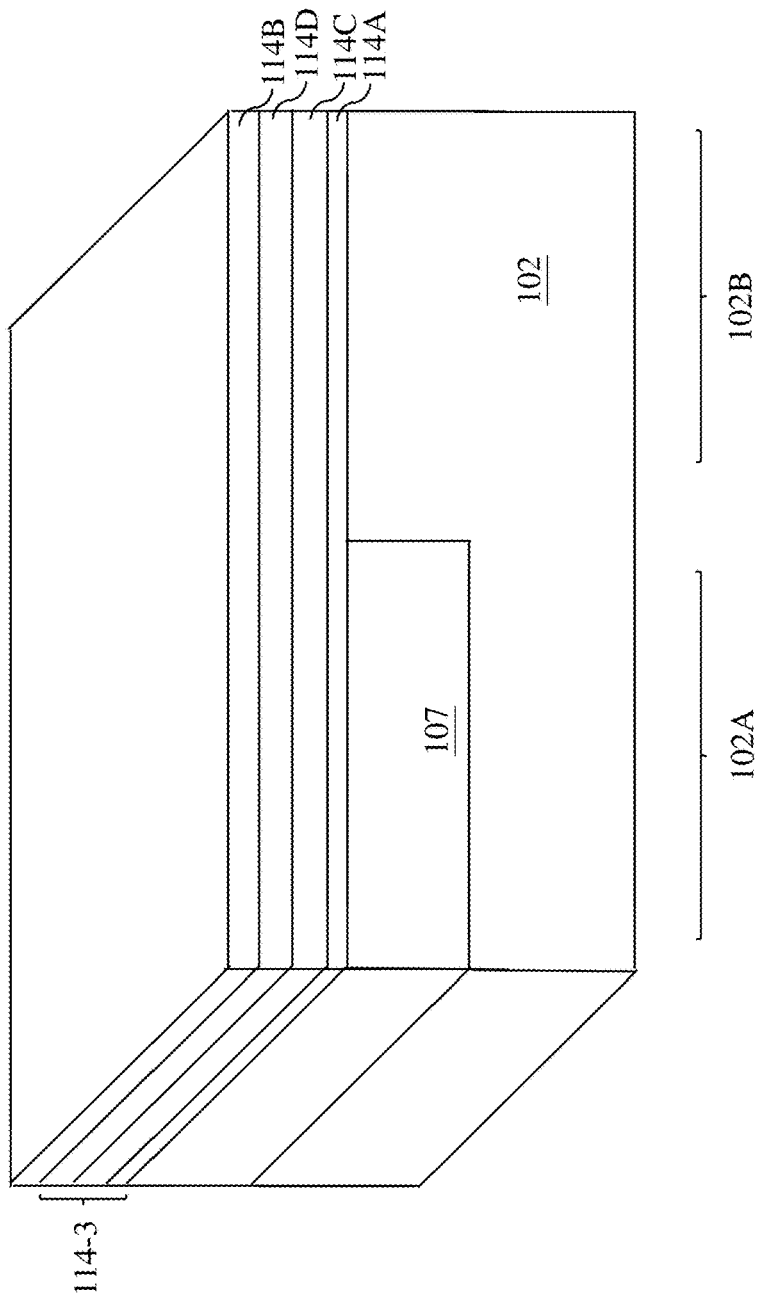

In some other embodiments as illustrated in FIG. 3C, the composite stress layer 114 (the composite stress layer 114 in FIG. 3C is also referred to as 114-3) further includes a fourth stress layer 114D that is inserted between the second stress layer 114B and the third stress layer 114C. The fourth stress layer 114D has a composition different from the other stress layers. In the present embodiment, the fourth stress layer 114D includes silicon carbon nitride (SiCN). The fourth stress layer 114D combined with the other stress layers with engineered stresses such that the composite stress layer 114-3 has the stress and the mechanical strength to eliminate or minimize the buckling issue, by tuning the stress and thickness of the fourth stress layer 114D. The fourth stress layer 114D may be formed by a suitable deposition technique, such as CVD with proper conditions. For example, the thickness of the fourth stress layer 114D can be tuned by deposition duration, and the stress can be tuned by deposition temperature and the partial pressure of the deposition precursor.

Figure 4:
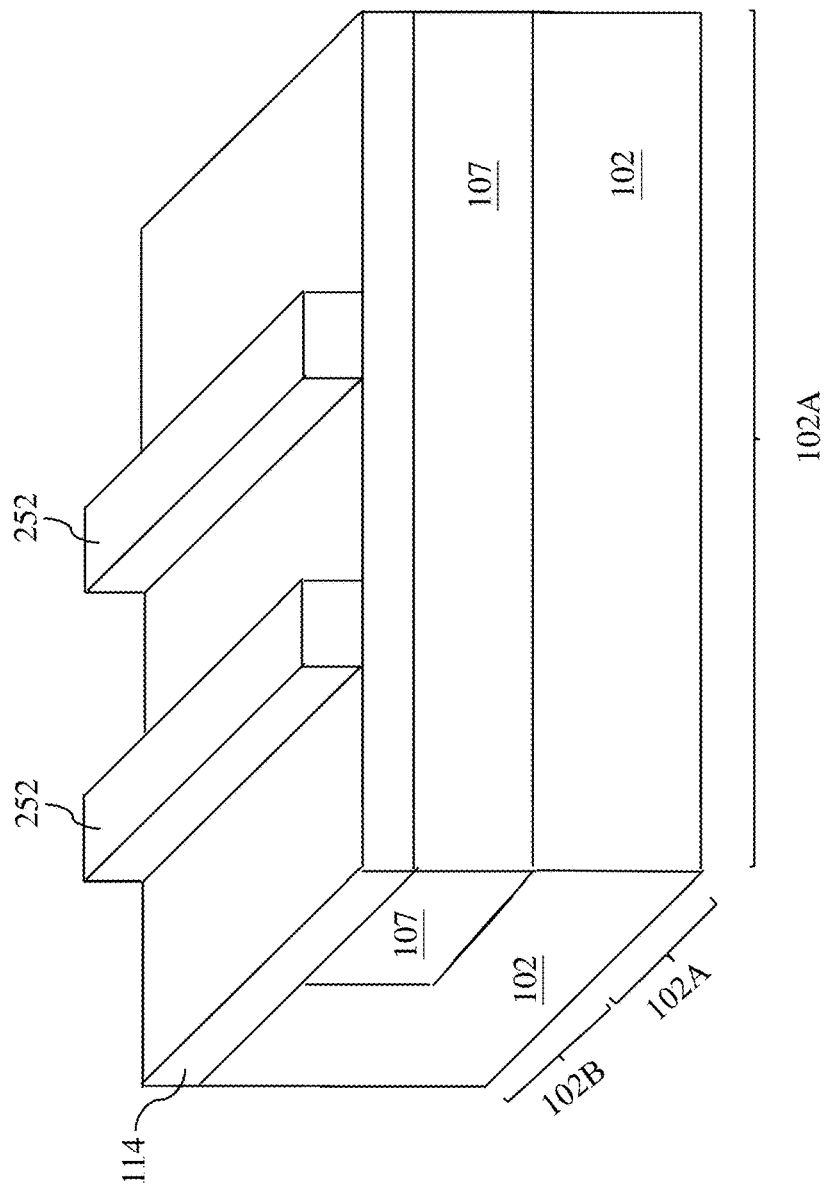
FIGS. 4 and 5 are sectional views of the semiconductor structure at various fabrication stages constructed according to some embodiments.
Figure 5:
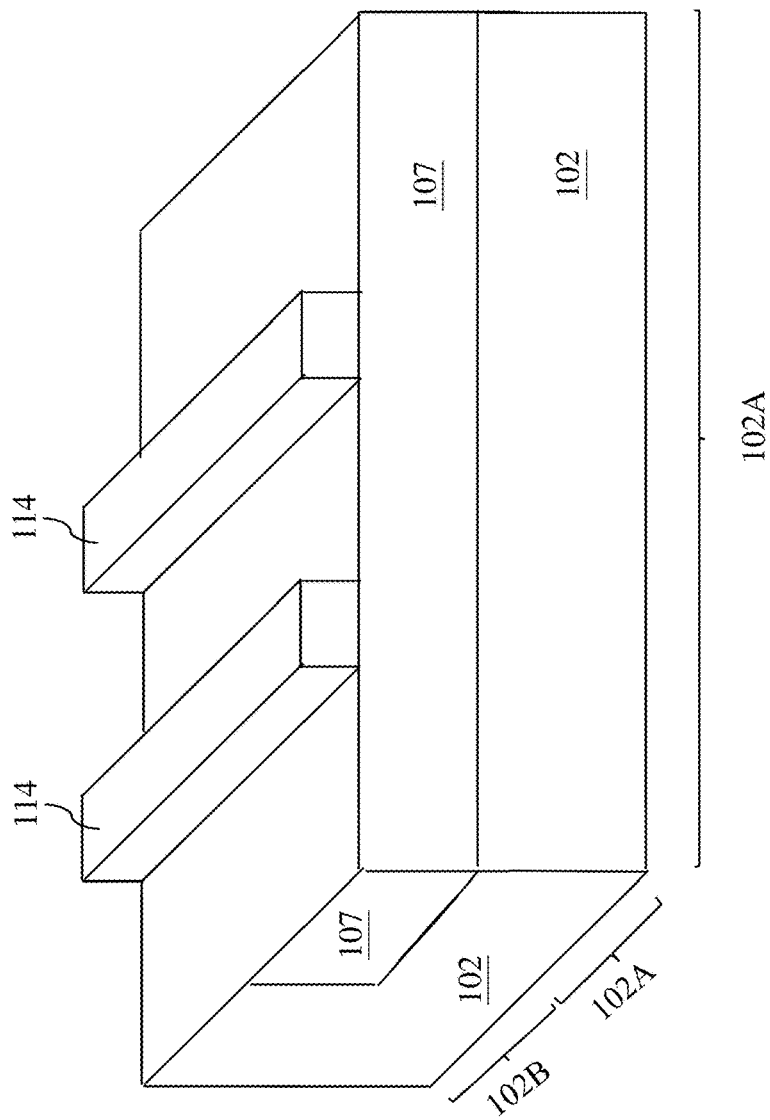
Figure 6:
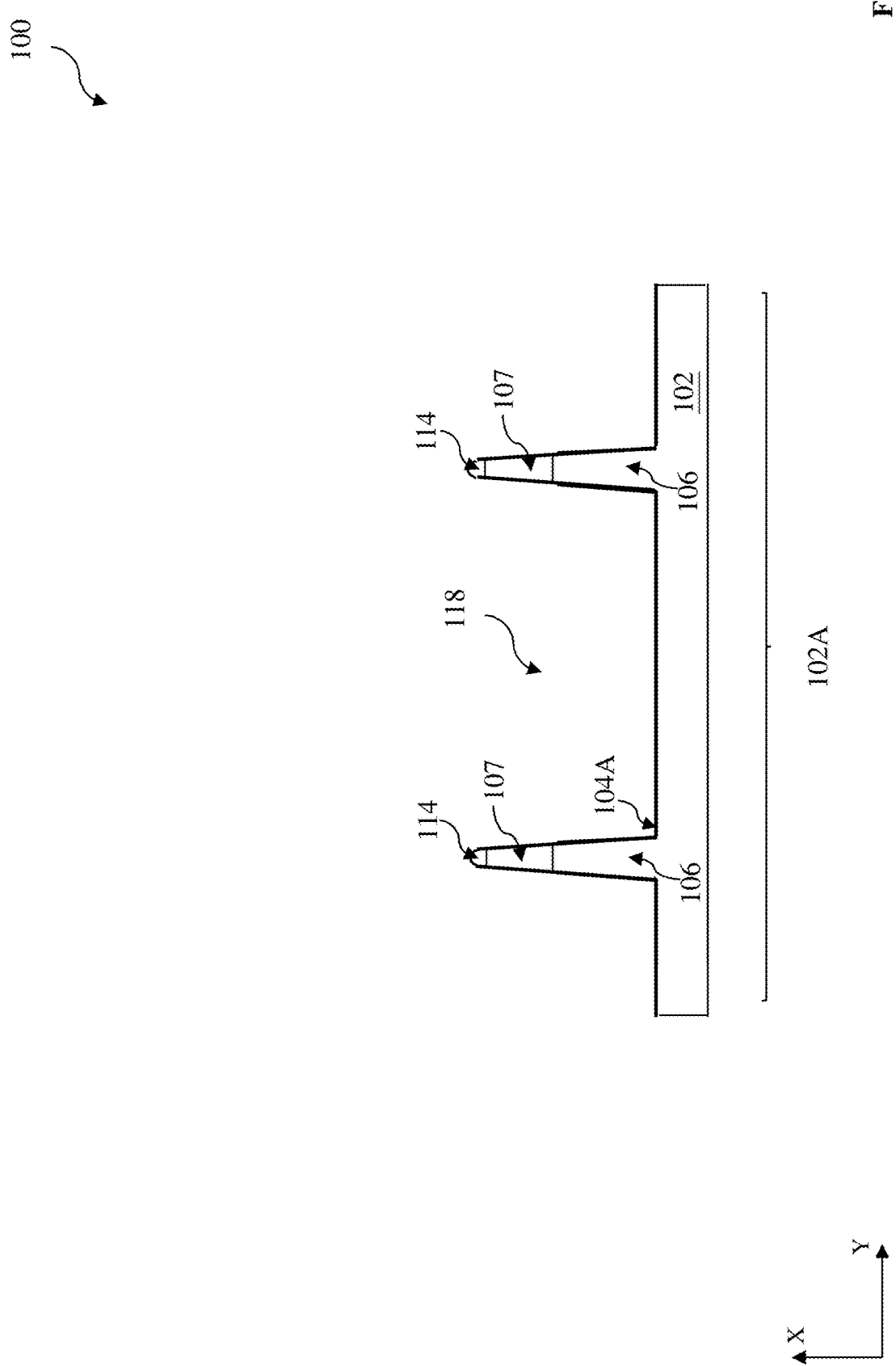
FIGS. 6, 7 and 8 are sectional views of the semiconductor structure at various fabrication stages constructed according to some embodiments.

Referring to FIGS. 4, 5 and 6, the method 200 proceeds to an operation 206 by forming various fin active regions 106, collectively a fin structure. In the operation 206, the semiconductor substrate 102, (including the SiGe layer 107) and the composite stress layer 114 are patterned to form fin active regions 106 and trenches between the adjacent fin active regions 106.

In the present example, the composite stress layer 114 is patterned by lithography patterning and etching. A photoresist (or resist) layer 252 used to define the fin structure may be formed on the composite stress layer 114, as illustrated in FIG. 4 in a perspective view. A resist layer 252 includes a photosensitive material that causes the layer to undergo a property change when exposed to light, such as ultraviolet (UV) light, deep UV (DUV) light or extreme UV (EUV) light. This property change can be used to selectively remove exposed or unexposed portions of the resist layer by a developing process. This procedure to form a patterned resist layer is also referred to as lithographic patterning or lithography process. In one embodiment, the resist layer is patterned to leave the portions of the photoresist material disposed over the semiconductor structure 100 by the lithography patterning process. After patterning the resist layer, an etching process is performed on the semiconductor structure 100 to open the composite stress layer 114, thereby transferring the openings from the resist layer 252 to the composite stress layer 114, as illustrated in FIG. 5 in a perspective view. The remaining resist layer may be removed after patterning the composite stress layer 114 by wet stripping or plasma ashing. In some examples, a lithography process includes spin-on coating a resist layer, soft baking of the resist layer, mask aligning, exposing, post-exposure baking, developing the resist layer, rinsing, and drying (e.g., hard baking). Alternatively, a lithographic process may be implemented, supplemented, or replaced by other methods such as maskless photolithography, electron-beam writing, and ion-beam writing. The etching process to pattern the composite stress layer 114 may include wet etching, dry etching or a combination thereof. The etching process may include multiple etching steps. For example, the amorphous silicon film in the composite stress layer 114 may be etched by a KOH solution and the silicon nitride films may be etched by a phosphoric acid solution.

Thereafter, another etching process is applied to the semiconductor substrate 102 including the SiGe layer 107 using the composite stress layer 114 as an etch mask, thereby forming trenches 118 and the fin active regions 106, as illustrated in FIG. 6 in a sectional view. The etching processes may include any suitable etching technique such as dry etching, wet etching, and/or other etching methods (e.g., reactive ion etching (RIE)). In some embodiments, the etching process includes multiple etching steps with different etching chemical, designed to etching the substrate to form the trenches with certain trench profile for improved device performance and pattern density. In some examples, the semiconductor material of the substrate may be etched by a dry etching process using a fluorine-based etchant. Particularly, the etching process applied to the substrate is controlled such that the substrate 102 is partially etched. This may be achieved by controlling etching time or by controlling other etching parameters. After the etching processes, the fin structure 106 having various fin active regions is formed on and extended from the substrate 102.

During various etching processes of the operation 206 and other subsequent processes, such as recessing the shallow trench isolation (STI) features, the fin active regions 106 experience various stresses and mechanical forces that may distort the fin active regions 106 due to its standing above the semiconductor substrate 102 and its high aspect ratio. The composite stress layer 114 is designed, with stacked multiple stress films and corresponding physical characteristics, such as stress, Young's modulus, density, composition and thickness, to compensate fin stress and/process-induced stress, reinforce the fin strength, and reduce/eliminate the fin buckling.

Figure 7:
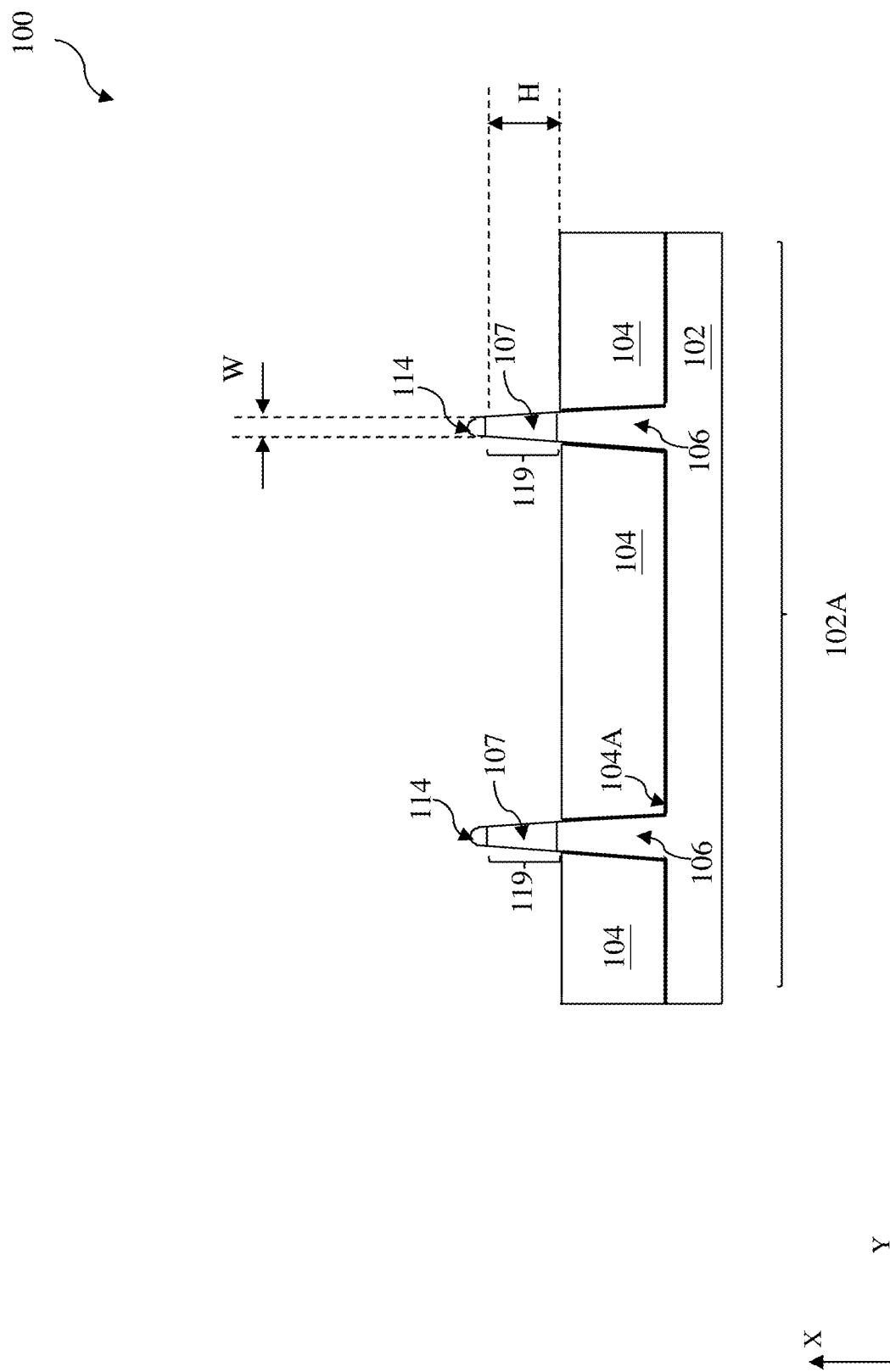

Referring to FIG. 7 in a sectional view, the method 200 proceeds to an operation 208 by forming various STI features 104 in the trenches 118. In the operation 208, the STI features 104 are formed by filling the trenches 118 with one or more dielectric material. In the present embodiment, as illustrated in FIG. 6, a lining material layer 104A, such as silicon nitride, is deposited by CVD or atomic layer deposition (ALD) on sidewalls and bottom surfaces of the trenches 118 to prevent oxidization of the fin active regions 106. Thereafter, one or more dielectric material is filled in the trenches 118 to form STI features 104. Suitable fill dielectric materials include semiconductor oxides, semiconductor nitrides, semiconductor oxynitrides, fluorinated silica glass (FSG), low-K dielectric materials, and/or combinations thereof. In various embodiments, the dielectric material is deposited using a high-density plasma CVD (HDP-CVD) process, a sub-atmospheric CVD (SACVD) process, a high-aspect ratio process (HARP), a flowable CVD (FCVD), and/or a spin-on process.

The operation 208 may further include a CMP process to remove the excessive dielectric material and planarize the top surface of the semiconductor structure 100. The CMP process may use the composite stress layer 114 as a polishing stop layer to prevent polishing the semiconductor substrate 102 including the SiGe layer 107. The operation 208 may further include an etching process to selectively recess the STI features 104 such that the fin active regions 106 are extruded above the top surface of the STI features 104, as illustrated in FIG. 7. During the corresponding CMP process and etching process, the portions of the lining material layer 104A above the recessed STI features 104 are removed as well.

The composite stress layer 114 functions as a hard mask during the operation 206 and a polishing stop layer during the operation 208 to form the fin active regions 106 and the STI features 104. Portions of the composite stress layer 114 may be lost during various etching and polishing process and other portions of the composite stress layer 114 remains on the top surface of the fin active regions 106, as illustrated in FIG. 7. In some examples, only the first stress layer 114A remains on the fin top surfaces. In some examples, the first stress layer 114A and the third stress layer 114C remain on the fin top surfaces. In yet some examples, the first and third stress layers (114A and 114C) and at least a portion of the second stress layer 114B remain on the fin top surfaces. In yet some other examples, the first, third and fourth stress layers (114A, 114C and 114D) and at least a portion of the second stress layer 114B remain on the fin top surfaces. In some embodiments, the remaining composite stress layer 114 has a round shape due to the etching loss and the etch characteristics. Thus, the remaining portions of the composite stress layer 114 are interposed between the gate stacks 110 and the fin active regions 106. Even though the composite stress layer 114 interposed between the gate dielectric layer 110A and the fin active regions 106 may change coupling between the gate electrode 110B and the channel 119, its impact is relatively small due to the high aspect ratio of the fin active regions 106. Each fin active region 106 has a height "H" measured from the top surface of the isolation features 104 and a width "W". The ratio of H/W is substantially greater than 1 in advanced technology nodes. In some examples, the height H ranges from 50 nm to 55 nm, the width W ranges from 2 nm to 5 nm, and the ratio H/W is greater than 10. The gate coupling to the channel 119 from both sidewalls of the fin active region 106 is proportional to 2*H (e.g., 100 nm or more in this example) while the gate coupling to the channel 119 from the top surface of the fin active region 106 is proportional to W (e.g., 5 nm or less in this example), so that the relative impact from the composite stress layer 114 on the top of the fin active region 106 is relatively small. For the first stress layer 114A, its thickness T ranges between 10 nm and 20 nm in some embodiments, as described earlier. The width W of the first stress layer 114A ranges from 2 nm to 5 nm. Furthermore, the ratio T/W of the first stress layer 114A is greater than 2, such as ranging between 2 and 10.

Figure 8:
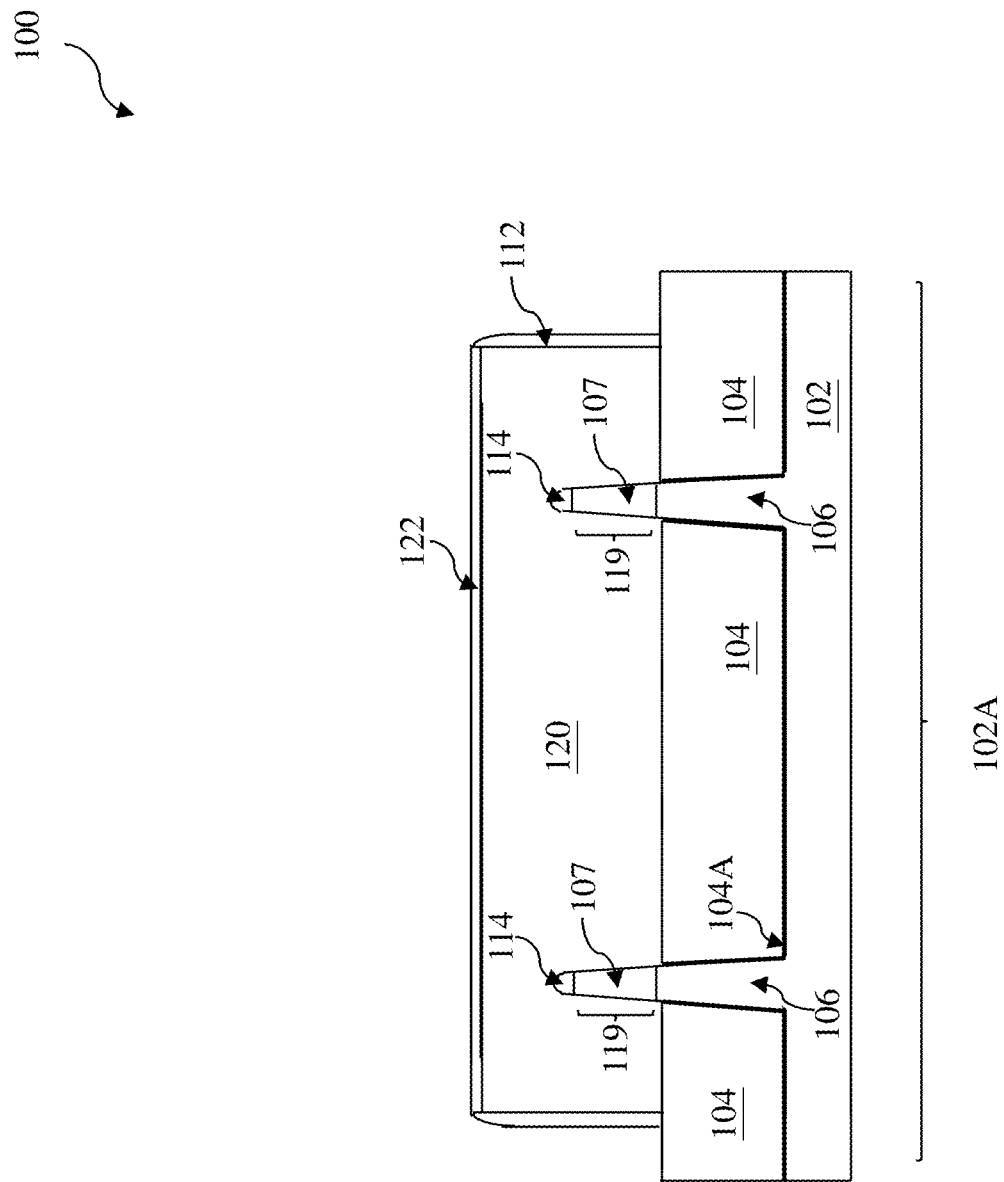

Referring to FIG. 8 in a sectional view, the method 200 proceeds to an operation 210 by forming various dummy gates 120 on the fin active regions 106 and the STI features 104. In the present embodiment, the dummy gates 120 have elongated shapes and are oriented in the Y direction while the fin active regions 106 are oriented in the X direction. Each of the dummy gates 120 may be disposed over multiple fin active regions 106. Especially, some dummy gates 120 or portions thereof are formed on the fin active regions 106 and some dummy gates 120 or portions thereof are formed on the STI feature 104. In some embodiments, one or more dummy gate is disposed on ends of the fin active regions 106 so that this gate is partially landing on the fin active region 106 and partially landing on the STI feature 104. Those edges are configured to reduce edge effect and improve overall device performance.

The dummy gates 120 each may include polysilicon and may additionally include silicon oxide underlying the polysilicon. The formation of the dummy gates 120 includes depositing the gate materials (including polysilicon in the present example); and patterning the gate materials by a lithographic patterning and etching. A gate hard mask 122 may be formed on the gate materials and is used as an etch mask during the formation of the dummy gates 120. The gate hard mask 122 may include any suitable material with etching selectivity, such as silicon oxide, silicon nitride, silicon carbide, silicon oxynitride, other suitable materials, and/or combinations thereof. In one embodiment, the gate hard mask 122 includes multiple films, such as silicon oxide and silicon nitride. In some embodiments, the patterning process to form the dummy gates 120 includes forming a patterned resist layer on the gate hard mask 122 by lithography process; etching the gate hard mask 122 using the patterned resist layer as an etch mask; and etching the gate materials to form the dummy gates 120 using the patterned gate hard mask 122 as an etch mask.

One or more gate sidewall features (or spacers) 112 are formed on the sidewalls of the dummy gates 120 and the sidewalls of the fin active regions 106 as well. The spacers 112 may be used to offset the subsequently formed source/drain features and may be used for constraining or modifying the source/drain structure profile. The spacers 112 may include any suitable dielectric material, such as a semiconductor oxide, a semiconductor nitride, a semiconductor carbide, a semiconductor oxynitride, other suitable dielectric materials, and/or combinations thereof. The spacers 112 may have multiple films, such as two films (a silicon oxide film and a silicon nitride film) or three films ((a silicon oxide film; a silicon nitride film; and a silicon oxide film). The formation of the spacers 112 includes deposition and anisotropic etching, such as dry etching.

The dummy gates 120 are configured in the fin active regions 106 for various field effect transistors, therefore the corresponding FETs are also referred to as FinFETs. In the present examples, the field effect transistors include p-type FETs within the first region 102A and n-type FETs within the second region 102B. In other examples, those field effect transistors are configured to form a logic circuit, a memory circuit (such as one or more static random-access memory (SRAM) cells) or other suitable circuit.

Figure 9:
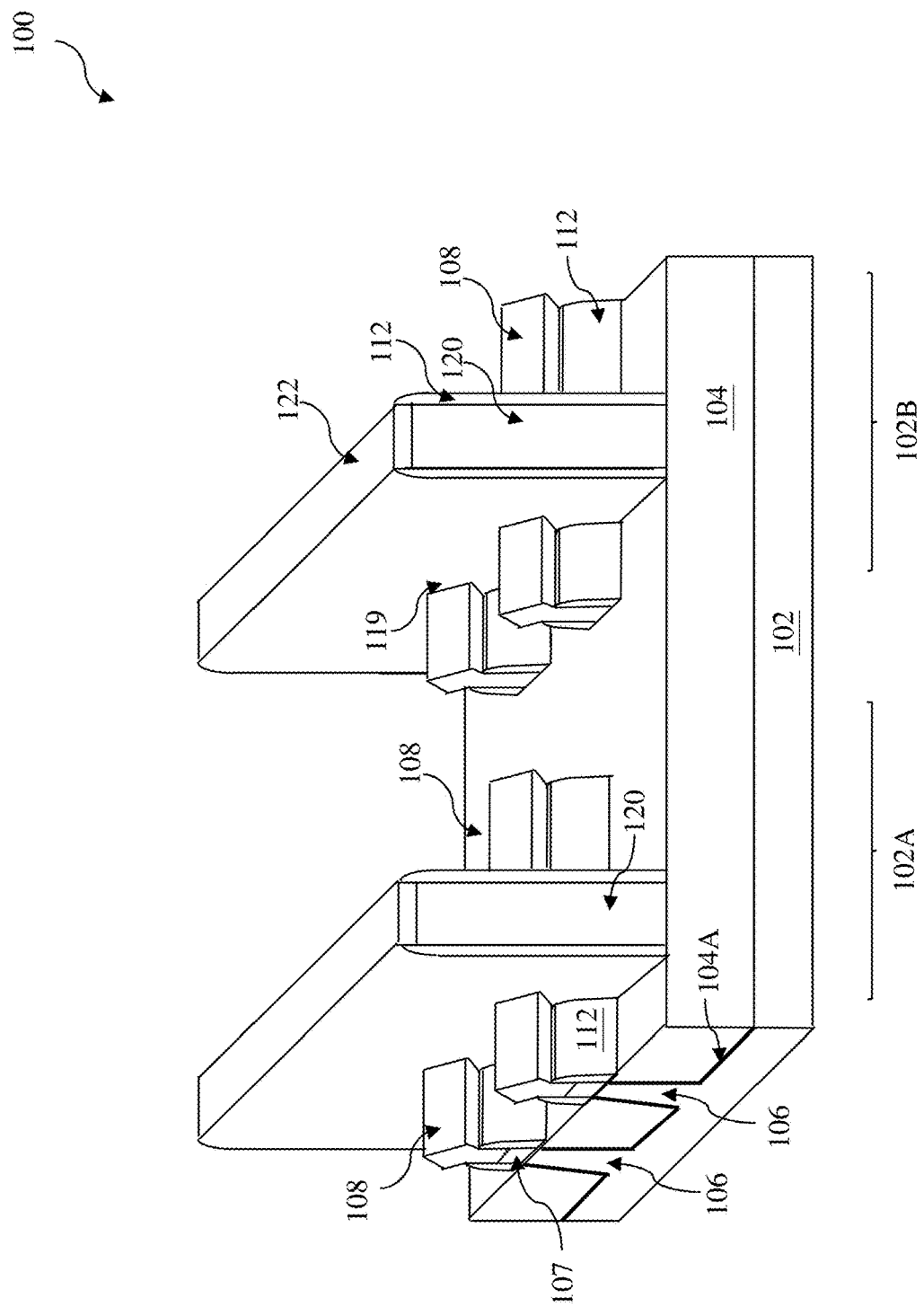
FIGS. 9, 10 and 11 are perspective views of the semiconductor structure at various fabrication stages constructed according to some embodiments.

Referring to FIG. 9 in a perspective view, the method 200 proceeds to an operation 212 by forming various sources and drains 108 to respective FinFETs. The sources and drains 108 may include both light doped drain (LDD) features and heavily doped source and drain (S/D). Each field effect transistor includes a source and a drain formed on the respective fin active region and interposed by the dummy gates 120. A channel 119 is formed in the fin active region in a portion that is underlying the dummy gate and spans between the source and drain 108.

The raised sources and drains 108 may be formed by selective epitaxial growth for strain effect with enhanced carrier mobility and device performance. The dummy gates 120 and the spacers 112 constrain the sources and drains 108 to be selectively grown within the source/drain regions with proper profile. In some embodiments, the sources and drains 108 are formed by one or more epitaxial (epi) processes, whereby Si features, SiGe features, SiC features, and/or other suitable features are grown in a crystalline state on the fin active regions 106. Alternatively, an etching process is applied to recess the source/drain regions before the epitaxial growth. Suitable epitaxial processes include CVD deposition techniques (e.g., vapor-phase epitaxy (VPE) and/or ultra-high vacuum CVD (UHV-CVD), molecular beam epitaxy, and/or other suitable processes. The epitaxial process may use gaseous and/or liquid precursors, which interact with the composition of the fin structure 106. In some embodiments, adjacent sources/drains may be grown to merge together to provide increased contact area and reduce the contact resistance. This can be achieved by controlling the epitaxial growth process.

The sources and drains 108 may be in-situ doped during the epitaxial process by introducing doping species including: p-type dopants, such as boron or $BF_2$; n-type dopants, such as phosphorus or arsenic; and/or other suitable dopants including combinations thereof. If the sources and drains 108 are not in-situ doped, an implantation process is performed to introduce the corresponding dopant into the sources and drains 108. In an embodiment, the sources and drains 108 in an nFET include SiC or Si doped with phosphorous, while those in a pFET include Ge or SiGe doped with boron. In some other embodiments, the raised sources and drains 108 include more than one semiconductor material layers. For example, a silicon germanium layer is epitaxially grown on the substrate within the source/drain regions and a silicon layer is epitaxially grown on the silicon germanium layer. One or more annealing processes may be performed thereafter to activate the sources and drains 108. Suitable annealing processes include rapid thermal annealing (RTA), laser annealing processes, other suitable annealing technique or a combination thereof.

The sources and drains 108 are disposed on both sides of the dummy gates 120. The channel 119 is underlying the corresponding gate stack 120 and is interposed between the corresponding source and drain 108 with proper doping concentrations and doping profiles. For examples, the channel 119 is p-type doped (or n-type doped) while the corresponding source and drain 108 are n-type doped (or p-type doped). The channel 119 is formed through one or more steps to introduce suitable dopants, such as by ion implantation.

Figure 10:
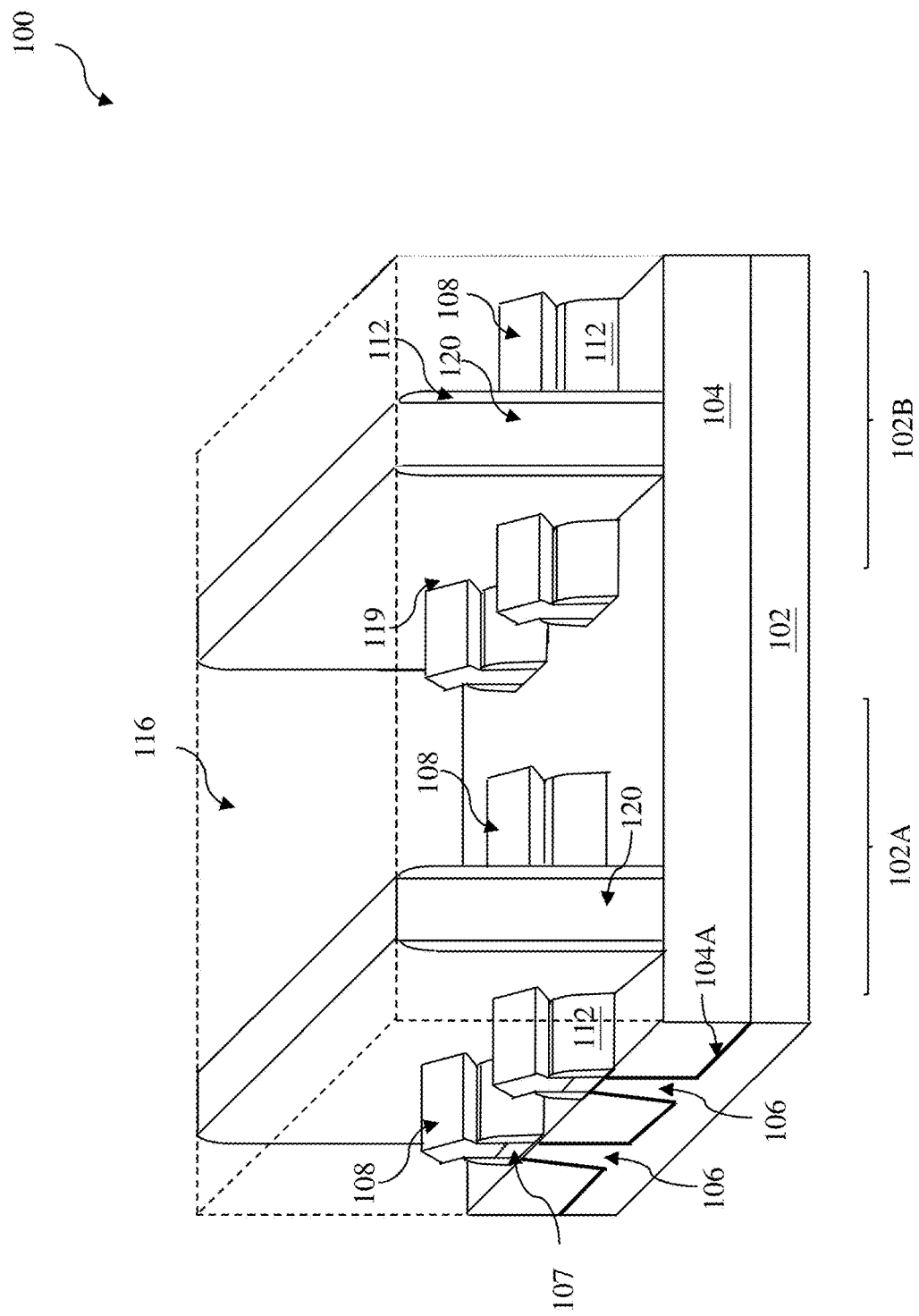

Referring to FIG. 10 in a perspective view, the method 200 proceeds to an operation 214, in which an ILD layer 116 is formed on the semiconductor substrate 102, covering the sources and drains 108. The ILD layer 116 is drawn with dashed lines in FIG. 10 and is illustrated as transparent to have better view of other features (such as the fin active regions 106, the dummy gates 120, and the sources and drains 108) embedded in the ILD layer 116. The ILD layer 116 surrounds the dummy gates 120 allowing the dummy gates 120 to be removed and a replacement gate to be formed in the resulting cavity (also referred to as gate trench). Accordingly, in such embodiments, the dummy gates 120 are removed after the formation of the ILD layer 116. The ILD layer 116 is also a part of an electrical interconnect structure that electrically interconnects various devices of the semiconductor structure 100. In such embodiments, the ILD layer 116 acts as an insulator that supports and isolates the conductive traces. The ILD layer 116 may include any suitable dielectric material, such as a semiconductor oxide, a semiconductor nitride, a semiconductor oxynitride, other suitable dielectric materials, or combinations thereof. In some embodiments, the ILD layer 116 includes a low-k dielectric material (with a dielectric constant less than that of silicon oxide). The formation of the ILD layer 116 may include deposition and CMP to provide a planarized top surface. The hard mask 122 may be removed by the CMP process or by a subsequent etching process.

Figure 11:
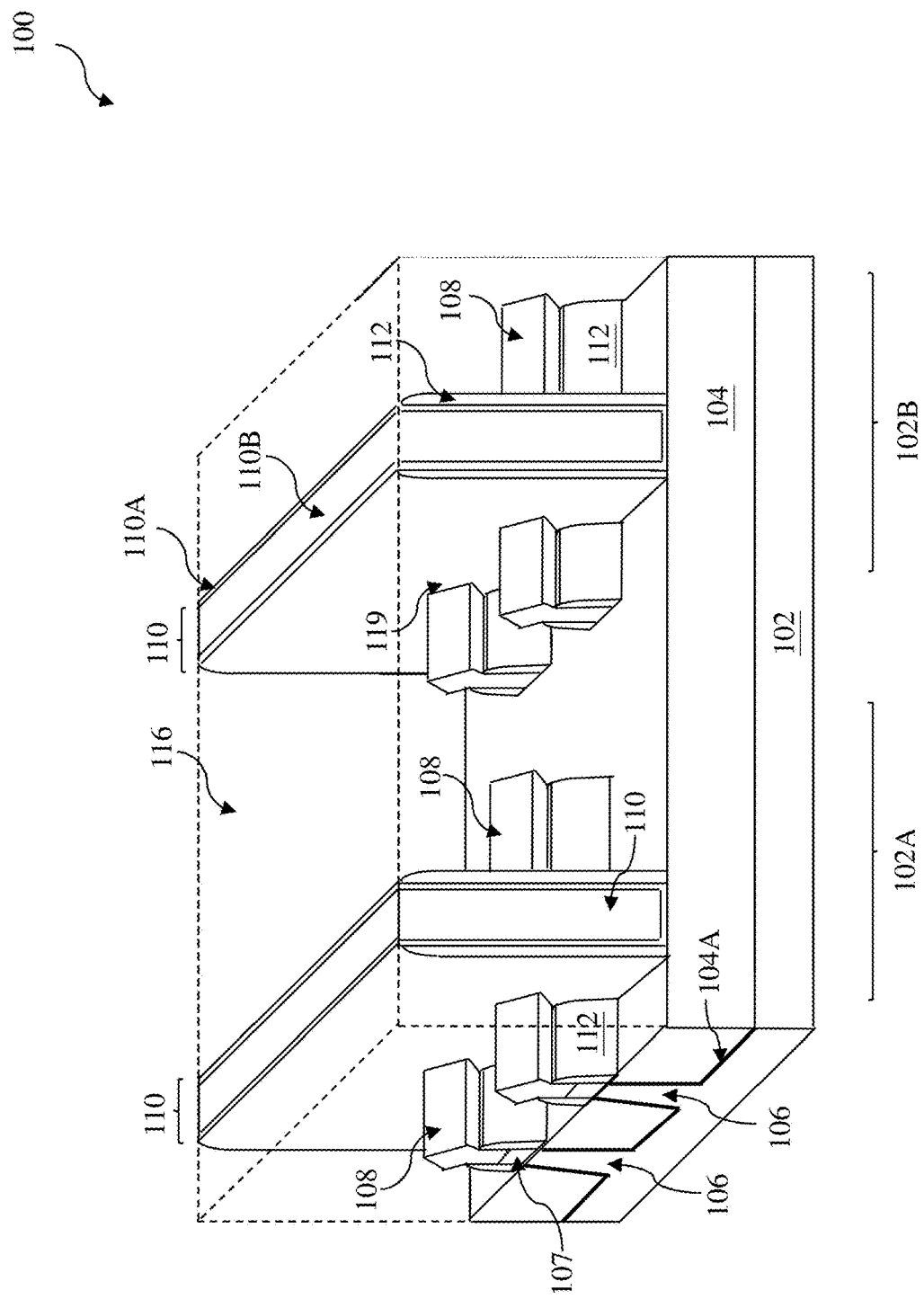

Referring to FIG. 11 in a perspective view, the method 200 proceeds to an operation 216 for gate replacement. The dummy gates 120 are removed and replaced by gate stacks 110 with high-k dielectric material and metal, therefore also referred to as high-k metal gate stacks 110. The gate replacement process may include etching, deposition and polishing. In the present embodiment, the dummy gates 120 are selectively removed by etching, resulting in gate trenches. Then the gate materials, such as high k dielectric material and metal, are deposited in the gate trenches to form the high-k metal gate stacks 110. A CMP process is further implemented to polish and remove the excessive gate materials from the semiconductor structure 100.

The gate stacks 110 are formed in the gate trenches by a proper procedure, such as a gate-last process or a high-k-last process. Although it is understood that the gate stacks 110 may have any suitable gate structure and may be formed by any suitable procedure. A gate stack 110 is formed on the semiconductor substrate 102 overlying the channel 119 of the fin active region 106. The gate stacks 110 include a gate dielectric layer 110A and a gate electrode 110B disposed on the gate dielectric layer 110A. In the present embodiment, the gate dielectric layer 110A includes a high-k dielectric material and the gate electrode 110B includes metal or metal alloy. In some examples, the gate dielectric layer 110A and the gate electrode 110B each may include a number of sub-layers. The high-k dielectric material may include metal oxide, metal nitride, such as LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfSiO, $(Ba,Sr)TiO_3$ (BST), $Al_2O_3$, $Si_3N_4$, oxynitrides (SiON), or other suitable dielectric materials. The gate electrode may include Ti, Ag, Al, TiAlN, TaC, TaCN, TaSiN, Mn, Zr, TiN, TaN, Ru, Mo, Al, WN, Cu, W, Ru, Co, or any suitable conductive materials. In some embodiments, different metal materials are used for nFET and pFET devices with respective work functions to enhance device performance.

The gate dielectric layer 110A may further include an interfacial layer sandwiched between the high-k dielectric material layer and the corresponding fin active region 106. The interfacial layer may include silicon oxide, silicon nitride, silicon oxynitride, and/or other suitable material. The interfacial layer is deposited by a suitable method, such as ALD, CVD, ozone oxidation, etc. The high-k dielectric layer is deposited on the interfacial layer (if the interfacial layer presents) by a suitable technique, such as ALD, CVD, metal-organic CVD (MOCVD), PVD, thermal oxidation, combinations thereof, and/or other suitable techniques. In some embodiments, the gate dielectric layer 110A is formed on the fin active regions 106 at the operation 210 that forms the dummy gates 120. In this case, the gate dielectric layer 110A is shaped as illustrated in FIG. 12. In some other embodiments, the gate dielectric layer 110A is formed in the high-k last process, in which the gate dielectric layer 110A is deposited in the gate trench at the operation 216. In this case, the gate dielectric layer 110A is U-shaped as illustrated in FIG. 13.

The gate electrode 110B may include multiple conductive materials. In some embodiments, the gate electrode 110B includes a capping layer 110B-1, a blocking layer 110B-2, a work function metal layer 110B-3, another blocking layer 110B-4 and a filling metal layer 110B-5. In furtherance of the embodiments, the capping layer 110B-1 includes titanium nitride, tantalum nitride, or other suitable material, formed by a proper deposition technique such as ALD. The blocking layer 110B-2 includes titanium nitride, tantalum nitride, or other suitable material, formed by a proper deposition technique such as ALD. In some examples, the block layer 110B-2 may not present.

The work functional metal layer 110B-3 includes a conductive layer of metal or metal alloy with proper work function such that the corresponding FET is enhanced for its device performance. The work function (WF) metal layer 110B-3 is different in composition for a pFET in the first region 102A and a nFET in the second region 102B, respectively referred to as an p-type WF metal and a n-type WF metal. Particularly, an n-type WF metal is a metal having a first work function such that the threshold voltage of the associated nFET is reduced. The n-type WF metal is close to the silicon conduction band energy (Ec) or lower work function, presenting easier electron escape. For example, the n-type WF metal has a work function of about 4.2 eV or less. A p-type WF metal is a metal having a second work function such that the threshold voltage of the associated pFET is reduced. The p-type WF metal is close to the silicon valence band energy (Ev) or higher work function, presenting strong electron bonding energy to the nuclei. For example, the p-type work function metal has a WF of about 5.2 eV or higher. In some embodiments, the n-type WF metal includes tantalum (Ta). In other embodiments, the n-type WF metal includes titanium aluminum (TiAl), titanium aluminum nitride (TiAlN), or combinations thereof. In other embodiments, the n-metal include Ta, TiAl, TiAlN, tungsten nitride (WN), or combinations thereof. In some embodiments, the p-type WF metal includes titanium nitride (TiN) or tantalum nitride (TaN). In other embodiments, the p-metal include TiN, TaN, tungsten nitride (WN), titanium aluminum (TiAl), or combinations thereof. The work function metal is deposited by a suitable technique, such as PVD. The n-type WF metal or the p-type WF metal may include various metal-based films as a stack for optimized device performance and processing compatibility.

The blocking layer 110B-4 includes titanium nitride, tantalum nitride, or other suitable material, formed by a proper deposition technique such as ALD. In various embodiments, the filling metal layer 110B-5 includes aluminum, tungsten, copper or other suitable metal. The filling metal layer 110B-5 is deposited by a suitable technique, such as PVD or plating.

The method 200 may include other fabrication processes 218 implemented before, during or after the operations described above. For example, the method 200 may include an operation to form a protection layer on top of the gate stacks 110 to protect the gate stacks 110 from loss during subsequent processing. The protection layer may include a suitable material different from the dielectric material of ILD layers to achieve etching selectivity during the etching process to form contact openings. In some embodiments, the protection layer includes silicon nitride. In other examples, the method 200 includes forming an interconnection structure on the semiconductor substrate 102 to connect various FETs and other devices into a circuit. The interconnection structure includes contacts, vias and metal lines through a suitable process. In the copper interconnection, the conductive features include copper and may further include a barrier layer. The copper interconnect structure is formed by a damascene process. A damascene process includes depositing an ILD layer; patterning the ILD layer to form trenches; depositing various materials (such as a barrier layer and copper); and performing a CMP process. A damascene process may be a single damascene process or a dual damascene process. The deposition of the copper may include PVD to form a seed layer and plating to form bulk copper on the copper seed layer. Other metals, such as ruthenium, cobalt, tungsten or aluminum, may be used to form to form the interconnection structure. In some embodiments, prior to filling conductive material in contact holes, silicide may be formed on the sources and drains 108 to further reduce the contact resistance. The silicide includes silicon and metal, such as titanium silicide, tantalum silicide, nickel silicide or cobalt silicide. The silicide may be formed by a process referred to as self-aligned silicide (or salicide). The process includes metal deposition, annealing to react the metal with silicon, and etching to remove unreacted metal. In some other embodiments, some other metal, such as ruthenium or cobalt, may be used for contacts and/or vias.

The present disclosure provides a semiconductor structure having FinFETs and a method making the same to reduce fin buckling issue. In the disclosed method, a composite stress layer is formed on the substrate for patterning fin active regions. The composite stress layer includes multiple dielectric films with engineered stresses to provide combined physical characteristics in order to reduce the fin buckling and further to function as hard mask during the subsequent patterning process to form fin active regions. The composite stress layer includes a first stress layer with higher density and lower stress and a second stress layer with lower density and higher stress on the first stress layer. Both layers are dielectric material layers with compressive stresses and include silicon nitride in the present embodiment. Furthermore, the first stress layer has a first Young's modulus and the second stress layer has a second Young's modulus being less than the first Young's modulus. The composite stress layer may include a third stress layer with a tensile stress and inserted between the first and second stress layers. In some embodiments, the third stress layer includes amorphous silicon. By implementing the disclosed structure and the method making the same in various embodiments, some of advantages described below may present. However, it is understood that different embodiments disclosed herein offer different advantages and that no particular advantage is necessarily required in all embodiments. As one example, the fin buckling issue is eliminated or reduced. In another example, LER is reduced to be less than 2.5 nm.

Thus, the present disclosure provides a method for fabricating a semiconductor structure in accordance with some embodiments. The method includes forming a composite stress layer on a semiconductor substrate, wherein the forming of the composite stress layer includes forming a first stress layer of a dielectric material with a first compressive stress and forming a second stress layer of the dielectric material with a second compressive stress on the first stress layer, the second compressive stress being greater than the first compressive stress; and patterning the semiconductor substrate to form fin active regions using the composite stress layer as an etch mask.

The present disclosure provides a method making a semiconductor structure in accordance with some other embodiments. The method includes forming a first stress layer of a first compressive stress on a semiconductor substrate; forming a second stress layer of a second compressive stress over the first stress layer; forming a third stress layer of a tensile stress between the first and second stress layers; and patterning the semiconductor substrate to form fin active regions using the first, second and third stress layers as an etch mask.

The present disclosure provides a method making a semiconductor structure in accordance with some other embodiments. The method includes forming a first stress layer of silicon nitride with a first stress on a semiconductor substrate using a first precursor containing $H_2$; forming a second stress layer of silicon nitride with a second stress on the first stress layer using a second precursor free of $H_2$, the second stress being greater stress than the first stress; patterning the first and second stress layers to form a patterned hard mask with openings; and etching the semiconductor substrate through the openings of the patterned hard mask to form fin active regions.

The present disclosure provides a semiconductor structure in accordance with some embodiments. The semiconductor structure includes a fin active region extruded above a semiconductor substrate; a gate stack disposed on a top surface and sidewalls of the fin active region, wherein the gate stack includes a gate dielectric layer and a gate electrode; and a composite stress layer interposed between the top surface of the fin active region and the gate dielectric layer, the composite stress layer having silicon nitride with engineered stress to prevent fin buckling.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method of forming an integrated circuit structure, the method comprising:
    forming a composite stress layer on a semiconductor substrate, wherein the forming of the composite stress layer includes forming a first stress layer with a first density and a first compressive stress and forming a second stress layer with a second density and a second compressive stress on the first stress layer, the second compressive stress being greater than the first compressive stress, and the second density being less than the first density; and
    patterning the semiconductor substrate to form an active region using the composite stress layer as an etch mask.

2. The method of claim 1, wherein
    the first stress layer includes a dielectric material; and
    the second stress layer includes the dielectric material.

3. The method of claim 2, wherein
    the first stress layer has the first compressive stress less than 0.5 GPa; and
    the second stress layer has the second compressive stress greater than 2.5 GPa.

4. The method of claim 3, wherein
    the first compressive stress of the first stress layer ranges between 0.2 GPa and 0.4 GPa; and
    the second compressive stress of the second stress layer ranges between 2.8 GPa and 3.0 GPa.

5. The method of claim 2, wherein
    the forming of the first stress layer includes depositing a first silicon nitride layer by chemical vapor deposition (CVD) using a first precursor including dichlorosilane ($SiH_2Cl_2$), $NH_3$ and $H_2$; and
    the forming of the second stress layer includes depositing a second silicon nitride layer by CVD using a second precursor including dichlorosilane and $NH_3$, the second precursor being free of $H_2$.

6. The method of claim 1, wherein
    the first stress layer has a first Young's module; and
    the second stress layer has a second Young's module less than the first Young's module.

7. The method of claim 1, wherein the forming of the composite stress layer further includes forming a third stress layer disposed between the first and second stress layers, wherein the third stress layer has a tensile stress while the first and second stress layer have compressive stresses.

8. The method of claim 7, wherein the forming of the third stress layer includes forming an amorphous silicon layer having the tensile stress ranging between –0.3 GPa and –0.5 GPa.

9. The method of claim 8, wherein
    the forming of the first stress layer includes forming the first stress layer by CVD with first deposition temperature;
    the forming of the second stress layer includes forming the second stress layer by CVD with second deposition temperature; and
    the forming of the third stress layer includes forming the amorphous silicon layer by CVD using a precursor having $Si_2H_6$ with a third deposition temperature less than the first and second deposition temperatures.

10. The method of claim 1, wherein the patterning of the semiconductor substrate to form the active region further includes:
    patterning the composite stress layer;
    etching the semiconductor substrate to form trenches using the patterned composite stress layer as an etch mask;
    filling the trenches with a dielectric material to form isolation features; and
    recessing the isolation features so that the active region is extruded above the recessed isolation features.

11. The method of claim 10, further comprising forming gate stacks on the active region, the gate stacks include a high-k dielectric material and a metal.

12. A method of forming an integrated circuit structure, the method comprising:

forming a first stress layer of a first compressive stress and a first composition on a semiconductor substrate;

forming a second stress layer of a tensile stress and a second composition on the first stress layer, the second composition being different from the first composition; and patterning the semiconductor substrate to form active regions using the first and second stress layers as an etch mask.

13. The method of claim 12, further comprising forming a third stress layer of a second compressive stress on the second stress layer, the second compressive stress being greater than the first compressive stress, wherein the patterning the semiconductor substrate includes patterning the semiconductor substrate using the first, second and third stress layers as the etch mask, the forming of the first stress layer of the first compressive stress includes forming the first stress layer of silicon nitride, the forming of the second stress layer of the tensile stress includes forming the second stress layer of amorphous silicon, and the forming of the third stress layer of the second compressive stress includes forming the third stress layer of silicon nitride.

14. The method of claim 13, wherein the second compressive stress is greater than the first compressive stress.

15. The method of claim 14, wherein the first compressive stress of the first stress layer is less than 0.5 GPa; and the second compressive stress of the second stress layer is greater than 2.5 GPa.

16. The method of claim 12, wherein the first stress layer has a first density and a first Young's module; and the second stress layer has a second density less than the first density and a second Young's module less than the first Young's module.

17. The method of claim 16, wherein the forming of the first stress layer includes depositing a first silicon nitride layer by chemical vapor deposition (CVD) using a first precursor including dichlorosilane ($SiH_2Cl_2$), $NH_3$ and $H_2$;

the forming of the second stress layer includes forming the amorphous silicon layer by CVD using a second precursor having $Si_2H_6$; and the forming of the third stress layer includes depositing of a second silicon nitride layer by CVD using a third precursor including dichlorosilane and $NH_3$, the third precursor being free of $H_2$.

18. The method of claim 12, wherein the first stress layer has a first thickness;

the second stress layer has a second thickness; and the third stress layer has a third thickness, wherein the second thickness is less than the first thickness and the first thickness is less than the third thickness.

19. A method of forming an integrated circuit structure, the method comprising:

forming a first stress layer of a first compressive stress on a semiconductor substrate;

forming a second stress layer of a second compressive stress over the first stress layer;

forming a third stress layer of a tensile stress between the first and second stress layers; and patterning the semiconductor substrate to form active regions using the first, second and third stress layers as an etch mask, wherein the third stress layer is different from the first and second stress layers in composition.

20. The method of claim 19, wherein the second compressive stress is greater than the first compressive stress; and the third stress layer includes amorphous silicon.

* * * * *